REGENERATIVE AMPLIFIER FOR CHANGING VOLTAGE LEVELS

Filed Dec. 20, 1965

INVENTOR.
LLOYD B. GUERNSEY
BY Warren F.B. Lindsley
ATTORNEY

United States Patent Office 3,378,782

Patented Apr. 16, 1968

3,378,782

REGENERATIVE AMPLIFIER FOR CHANGING VOLTAGE LEVELS

Lloyd B. Guernsey, Phoenix, Ariz., assignor to General Electric Company, a corporation of New York Filed Dec. 20, 1965, Ser. No. 515,120
10 Claims. (Cl. 330—26)

This invention relates to signal amplification and more particularly to transformer-coupled regenerative amplifiers for changing a voltage level in one direction only.

Pulse amplifiers have many applications in fields which employ digital techniques such as radar, telemetering and digital computing. In high speed digital computing systems, for example, it is desirable that signals applied to logic gates be brought up to their maximum voltage values or levels as rapidly as possible and then be retained at the level as long as it is desirable which may be merely a matter of mircoseconds or as long as several hours. Since these logic gates may occur at the end of one or more coaxial cables, a signal from a weak source such as a flip-flop may be too weak to bring the coaxial cable line voltage up to its required voltage level fast enough.

Amplifiers have been used to amplify the signals from weak pulse sources such as flip-flops used in the digital computer systems; however, these known amplifier structures including transformer-coupled regenerative amplifiers have remained electrically associated with the logic gates after amplification of a pulse and thereby have contributed toward signal degeneration through leakage flow of the charge back through the amplifier to a lower potential source.

Thus, an amplifying system is needed which will rapidly amplify a weak voltage pulse to a given voltage level and immediately thereafter remove itself from the load circuit.

In known regenerative pulse circuits, part of the energy from the output terminal of the amplifier is returned to its input terminal in such a manner that it is only necessary for the input signal to initiate the pulse amplification process and the feedback means supplies the major portion of the required input energy. It has been found with many of the regenerative pulse amplifiers, particularly of the transformer-coupled type, that the feedback energy is often large and feedback windings are needed on the transformer to limit the feedback energy. Accordingly, it is another feature of this invention to provide a new and improved regenerative transformer-coupled amplifier circuit arrangement in which the feedback energy providing the regenerative effect is effective without feedback limiting windings during only a part of one-half of a voltage cycle.

It is therefore one object of the present invention to provide a new and improved signal amplifier.

Another object of this invention is to provide a new and improved signal amplifier which can rapidly change a voltage level across an impedance.

A further object of this invention is to provide a new and improved regenerative pulse amplifier in which the regenerative effect is effective during only one-half or less of a voltage cycle.

A still further object of this invention is to provide a new and improved regenerative pulse amplifier in which the amplifier is electrically disconnected from the load after amplification of a pulse.

Another object of this invention is to provide a new and improved regenerative pulse amplifier in which substantially all of the output energy is fed to the load.

Other objects and advantages of this invention will become apparent from the following description when taken in connection with the accompanying drawings.

In accordance with the invention claimed, a new and improved unidirectional level changing regenerative transformer-coupled amplifier is provided. This amplifier employs a primary winding of the transformer as an input means for receiving pulse signals to be amplified and a first transistor as an amplifying means responsive to the pulse signals transmitted by the secondary winding of the transformer. An output terminal of the transistor is arranged to provide a feedback voltage through an R-C impedance and a second transistor to the primary winding of the transformer in phase with the change in voltage on the base of the first transistor to provide regeneration. The primary winding of the transformer is effective in causing regeneration during that time that the voltage is rising at the output terminal of the transistor which is at least a part of one-half of the voltage cycle. During the other part of the voltage cycle the first transistor is rendered nonconducting and is isolated from the input circuit because the transformer output voltage applied between the base and output electrodes of the transistor drops below a given value needed to maintain the transistor conductive.

Figure 1:
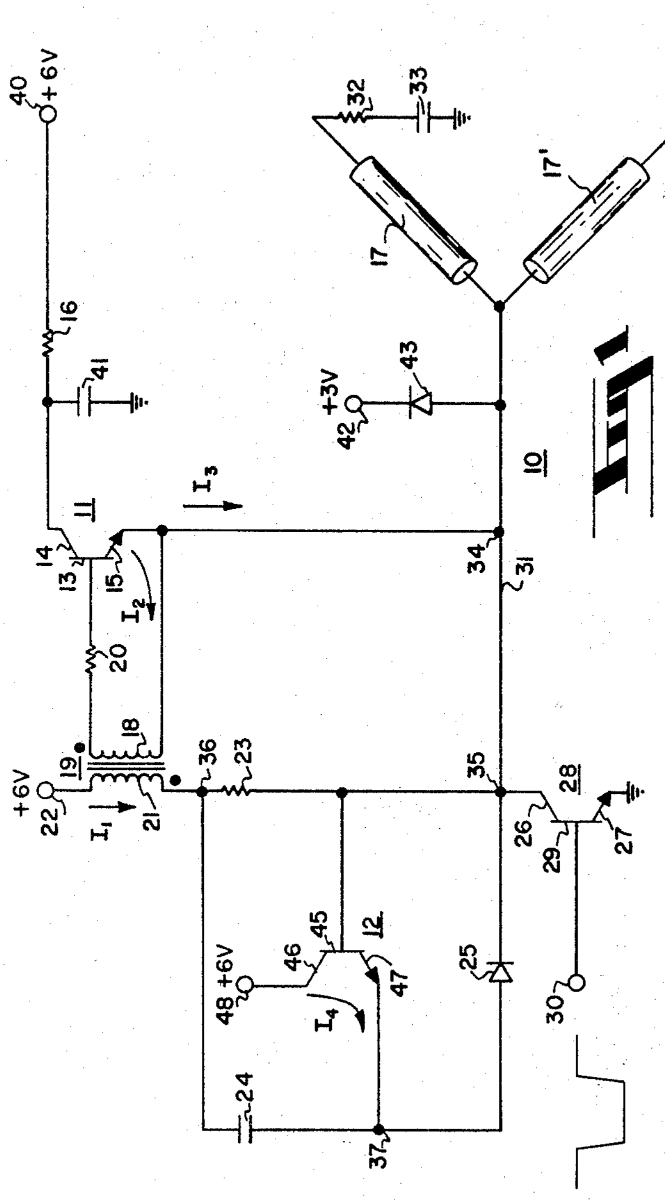
FIG. 1 is a schematic diagram of a transformer-coupled amplifier employing regulating feedback in accordance with the invention.

Referring more particularly to the drawing by characters of reference, FIG. 1 discloses a regenerative transformer-coupler amplifier 10 utilizing a pair of the transistors 11 and 12 embodying the transformer feedback feature of the invention. As indicated in FIG. 1, transistor 11 comprises a base 13, a collector 14 and an emitter 15. Since transistor 11 is of the NPN type, the collector 14 is coupled through a resistor 16 to a suitable positive potential source such as +6 volts and the emitter 15 is coupled to a load circuit such as, for example, coaxial cables 17, 17′.

An input signal is applied to base 13 of transistor 11 by the secondary winding 18 of transformer 19. One terminal of winding 18 is connected to base 13 through a resistor 20 while the other terminal of secondary winding 18 is connected to emitter 15 of transistor 11. The primary winding 21 of transformer 19 is connected at one end thereof to terminal 22 which is connected to a +6 volt source and the other end of winding 21 is connected through an impedance means comprising a parallel arrangement of resistor 23 and capacitor 24 and diode 25 and the collector 26 and emitter 27 of an NPN transistor 28 to ground. The base 29 of transistor 28 is connected to terminal 30 which is coupled to a suitable source of signal pulses such as, for example, a flip-flop circuit (not shown). Transistor 28 and terminal 30 provide an input means for coupling signals to the primary winding 21 of transformer 19. Collector 26 of transistor 28 is coupled through conductor or output 31 to the coaxial cables 17, 17,′ thereby providing a feedback connection between the emitter or output terminal of amplifier 10 to the primary winding 21 of transformer 19. Dots are shown at the ends of windings 18 and 21 of transformer 19 to represent the phase of the voltage induced in one winding with respect to the other winding. It will be noted that, if the voltage rises in the primary winding 21 of transformer 19 at the dot end thereof, the voltage in the transformer's secondary winding 18 will also rise at the dot end.

As shown in FIG. 1, the coaxial cables 17, 17′ are arranged in series with the resistors 32, 32′ and capacitors 33, 33′ connected between the ends of cables 17, 17′ and ground. Resistors 32, 32′ are chosen so that they substantially match the impedance value of the coaxial cables 17, 17′.

In the absence of a negative going pulse being applied to the base 29 of transistor 28, the voltage at base 29 will be positive with respect to its emitter 27, thereby rendering transistor 28 conductive. Under these conditions current $I_1$ will flow from terminal 22 through the primary winding 21 of transformer 19, resistor 23, and collector and emitter 26 and 27 of transistor 28 to ground. Current $I_1$ through the primary winding 21 provides a magnetic flux through both the primary winding 21 and the secondary winding 18.

Upon the application of a negative signal pulse, as shown at terminal 30, to the base of transistor 28, base 29 will be rendered sufficiently negative with respect to its emitter 27 to render transistor 28 nonconductive. Current $I_1$ will then flow through conductor 31, coaxial cables 17, 17′, line matching impedance comprising resistors 32, 32′ and capacitors 33, 33′ to ground.

Due to the inductance of the primary winding 21 of transformer 19 and the magnetic flux through the primary winding, current $I_1$ at this instant will be the same value as it was during the previous instant when it was flowing through transistor 28 to ground. This current flow through coaxial cables 17, 17′ causes the voltage at junction point 34 to increase suddenly which in turn causes a voltage at junction points 35 and 36 to increase. This increase in voltage at the dot end of the primary winding 21 of transformer 19 will cause a decrease in current through the primary winding. This decrease in current causes a decrease in magnetic flux which, in turn causes an increase in voltage at the dot end of the secondary winding 18 of transformer 19, thereby rendering base 13 of transistor 11 sufficiently positive with respect to its emitter to render transistor 11 conductive. Rendering transistor 11 conductive causes a current $I_2$ to flow through the closed loop circuit comprising secondary winding 18 of transformer 19, resistor 20, base and emitter 13 and 15 of transistor 11, and a further current $I_3$ to flow from terminal 40 through resistor 16, the collector and emitter of transistor 11, coaxial cables 17, 17′, line matching impedances comprising resistors 32, 32′ and capacitors 33, 33′ to ground. Resistor 16 limits the current flow from terminal 40 through transistor 11 while capacitor 41 provides a relatively large momentary current flow through transistor 11 at the instant that transistor 11 is rendered conductive.

This current flow $I_3$ further increases the potential at junction point 34 and in turn raises the potential at junction points 35 and 36. This further increase of potential at junction point 36 further decreases current $I_1$ through the primary winding 21 which causes a more rapid change in magnetic flux and increases potential at the dot end of secondary winding 18 thereby driving the base 13 of transistor 11 more positive. This regenerative action continues until the voltage at junction point 34 reaches a given value which is determined by the voltage source coupled through terminal 42 and clamping diode 43 to junction point 34.

The voltage at junction point 34 and the voltage across capacitor 24 causes the voltage at junction point 36 to rise above the value of the voltage applied to terminal 22. A current now flows from junction point 37 through capacitor 24, junction point 36, primary winding 21 to terminal 22, thereby maintaining a positive potential at the dot end of primary winding 21. This current maintains the regenerative action of the amplifier during the time that the potential at junction point 34 is building up to the clamp voltage of diode 43. Prior art amplifier circuits usually arrange for a substantial part of the load current, for example, part of current $I_3$, to flow from junction point 34 to provide this current and to maintain the positive potential at the dot end of primary winding 21. Such a use of a portion of current $I_3$ prevents the voltage at junction point 34 from rising as fast as it would otherwise rise.

The circuit shown in FIG. 1 alleviates the disadvantages of the prior art circuits by employing a second transistor to provide the current through capacitor 24 and primary winding 21. Transistor 12 provides a current $I_4$ to maintain the regenerative action of the amplifier and cause the voltage at junction point 34 to rise much more rapidly than in prior circuits. The increase in voltage at junction point 34 causes an increase in voltage at base 45 of transistor 12 thereby rendering base 45 sufficiently positive with respect to emitter 47 to render transistor 12 conductive. Rendering transistor 12 conductive causes current $I_4$ to flow from terminal 48 through collector 46, emitter 47, junction point 37, capacitor 24, junction point 36 and primary winding 21 to terminal 22.

When junction point 34 reaches substantially the potential value of the source connected to terminal 42, the potential at junction points 35 and 36 ceases to rise any further. Capacitor 24 which had been previously charged to 6 volts by current flow $I_1$ now has been partially discharged by current $I_4$ flowing through it to terminal 22. The high current sustained through secondary winding 18 during the transition period now starts to decay at the end of the same period. The current approximately follows an $L/R$ exponential decay curve through the secondary winding 18 of transformer 19 until it is no longer large enough to hold the base 13 of transistor 11 positive enough to keep transistor 11 conductive. Transistor 11 is then rendered nonconductive and currents $I_2$ and $I_3$ cease to flow.

Current from terminal 22 flowing through winding 21 of transformer 19, resistor 23, conductor 31 and diode 43 to terminal 42 keeps the voltage at junction point 34 and hence the coaxial cables approximately equal to the voltage at terminal 42 when transistor 28 is in its nonconductive state.

Diode 25 provides a charge path for capacitor 24 when transistor 28 returns to its conductive state. Current flows from terminal 22 through primary winding 21, capacitor 24, diode 25, and collector 26 and emitter 27 of transistor 28 to ground. This current quickly recharges capacitor 24.

Figures 2, 3:
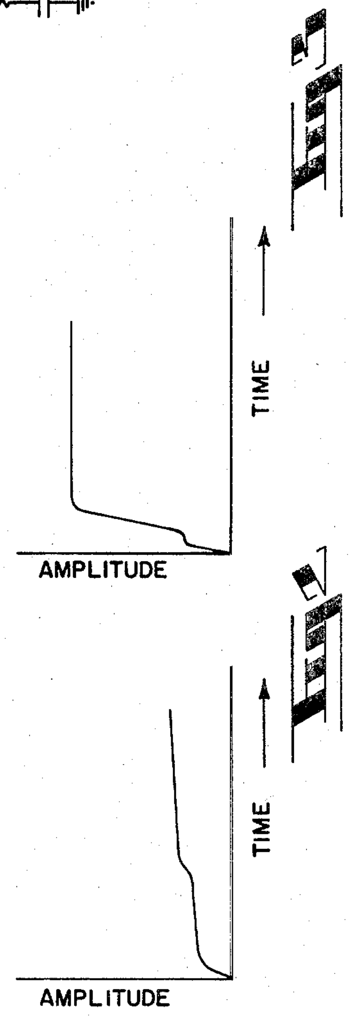
FIG. 2 is a graphic representation of the voltage waveform at the load circuit when the driving current is small in one direction as provided directly from a signal source such as a flip-flop.
FIG. 3 is a graphic representation of the voltage waveform at the same load circuit referred to in FIG. 2 when the driving current is provided by the amplifier claimed.

FIG. 2 is a graphic representation of a voltage waveform at junction point 34 when the driving current is provided by a unidirectional weak signal source such as a flip-flop.

FIG. 3 is a graphic representation of the voltage waveform at junction point 34 when the driving current is provided by the subject invention. The amplifying means shown comprising transistors 11 and 12 provides sufficient current so that the voltage at junction point 34 rises much more rapidly than the voltage shown in the graphic representation of FIG. 2. In accordance with the invention claimed, the voltage at junction point 34 reaches substantially the clamped value of terminal 42 with very little reflected current due to R-C termination of the coaxial cables by resistors 32, 32′ and capacitors 33, 33′.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only of the true spirit and scope of the invention.

What is claimed is:

1. A regenerative amplifier for changing a voltage level in one direction only comprising: first and second transistors each having a base, a collector and an emitter; a transformer having a primary winding and a secondary winding; a voltage potential; said collector of said first transistor being connected to said potential, means for coupling a first end of said primary winding to said emitter of said first transistor, a second end of said primary winding being connected to said potential, said base of said first transistor being coupled to said emitter of said second transistor; resistive means connected between said first end of said primary winding and said base of said first transistor; input means for coupling signals to said primary winding of said transformer; and output means connected to said emitter of said second transistor, coupling means connecting a first end of said secondary winding to said base of said second transistor, said secondary winding having a second end connected to said emitter of said second transistor to provide a feedback voltage to said primary winding in phase with the change in voltage on said base of said second transistor to provide regeneration, said secondary winding causing regeneration to be effective during at least a part of one-half of the voltage cycle; and means connecting said collector of said second transistor to said potential.

2. A regenerative amplifier as defined in claim 1 including: a second voltage potential; and clamping means, said clamping means being connected between said second potential and said emitter of said second transistor for controlling the output potential of said amplifier.

3. A regenerative amplifier as defined in claim 1 wherein the means for coupling a first end of said primary winding to said emitter of said first transistor includes a capacitor.

4. A regenerative amplifier as defined in claim 1 including: diode means connected between said base and said emitter of said first transistor.

5. A regenerative amplifier as defined in claim 1 wherein the input means in claim 1 includes: a switching transistor having a base, a collector and an emitter, said collector of said switching transistor being connected to said base of said first transistor, said emitter of said switching transistor being connected to ground; and including means for applying an input signal to said base of said switching transistor to energize said regenerative amplifier.

6. A regenerative amplifier as defined in claim 5 wherein the secondary winding of said transformer causes regeneration to be effective during only a part of one-half of the voltage cycle.

7. A regenerative amplifier as defined in claim 5 including: diode means connected between said base and said emitter of said first transistor.

8. A regenerative amplifier as defined in claim 5 wherein: the means for coupling a first end of said primary winding to said emitter of said first transistor includes a capacitor.

9. A regenerative amplifier as defined in claim 5 including: a second voltage potential; a clamping means, said clamping means being connected between said second potential and said emitter of said second transistor for controlling the output potential of said amplifier.

10. A regenerative amplifier as defined in claim 9 including: diode means connected between said base and said emitter of said first transistor and wherein the means for coupling a first end of said primary winding to said emitter of said first transistor includes a capacitor.

References Cited

UNITED STATES PATENTS

| | | | |
|---|---|---|---|
| 3,281,704 | 10/1966 | Crain | 330—26 |
| 3,322,966 | 5/1967 | Allmark | 307—88.5 |

ROY LAKE, *Primary Examiner.*

J. B. MULLINS, *Assistant Examiner.*